(12) United States Patent
Qi et al.

(10) Patent No.: US 9,079,714 B2
(45) Date of Patent: Jul. 14, 2015

(54) GLASS SUBSTRATE CASSETTE AND PICK-AND-PLACE SYSTEM FOR GLASS SUBSTRATE

(75) Inventors: Minghu Qi, Guandong (CN); Chunhao Wu, Guandong (CN); Kunhsien Lin, Guandong (CN); Yongqiang Wang, Guandong (CN); Xiande Li, Guandong (CN); Weibing Yang, Guandong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 229 days.

(21) Appl. No.: 13/582,997

(22) PCT Filed: Aug. 8, 2012

(86) PCT No.: PCT/CN2012/079844
§ 371 (c)(1),
(2), (4) Date: Sep. 6, 2012

(87) PCT Pub. No.: WO2014/019246
PCT Pub. Date: Feb. 6, 2014

(65) Prior Publication Data
US 2014/0037406 A1    Feb. 6, 2014

(30) Foreign Application Priority Data
Jul. 31, 2012    (CN) .......................... 2012 1 0271284

(51) Int. Cl.
*H01L 21/67* (2006.01)
*H01L 21/673* (2006.01)
*B65G 1/10* (2006.01)
*B65G 1/12* (2006.01)
*H01L 21/677* (2006.01)

(52) U.S. Cl.
CPC .. *B65G 1/10* (2013.01); *B65G 1/12* (2013.01); *H01L 21/6732* (2013.01); *H01L 21/6734* (2013.01); *H01L 21/67778* (2013.01)

(58) Field of Classification Search
CPC ................. H01L 21/6732; H01L 21/67373; H01L 21/67748; B65G 1/10; B65G 1/12; B65G 1/127; B65G 1/133
USPC .................. 414/277, 935, 416.03, 416.08; 211/41.18; 206/711; 312/334.7
See application file for complete search history.

(56) References Cited

U.S. PATENT DOCUMENTS 4,901,011 A * 2/1990 Koike et al. ............... 324/756.02
7,086,540 B2 * 8/2006 Huang et al. ................ 211/41.18
(Continued)

FOREIGN PATENT DOCUMENTS

CN          1807199 A  *  7/2006  ............ B65G 49/06

*Primary Examiner* — Saul Rodriguez
*Assistant Examiner* — Ashley Romano
(74) *Attorney, Agent, or Firm* — Andrew C. Cheng

(57) ABSTRACT

The present invention discloses a glass substrate cassette and pick-and-place system for glass substrates. The glass substrate cassette comprises: a cassette case, comprising a pair of side walls disposed in parallel and vertically; and a plurality of support racks, disposed inside the cassette case for supporting glass substrates, each support rack comprising a pair of connecting elements supporting respectively the pair of side walls and a plurality of support elements lined up in parallel along a first horizontal direction and connected to the pair of connecting elements, connecting element able to move along the first horizontal direction with respect to the side walls and at least partially beyond the cassette case. The support rack of the present invention can move beyond cassette to realize random pick-and-place of glass substrate at any layer.

15 Claims, 3 Drawing Sheets

(56) References Cited

U.S. PATENT DOCUMENTS

| | | | |
|---|---|---|---|
| 2005/0236110 A1* | 10/2005 | Bhatt et al. | 156/345.32 |
| 2006/0182556 A1* | 8/2006 | Liu et al. | 414/331.01 |
| 2007/0020067 A1* | 1/2007 | Lin et al. | 414/331.09 |
| 2007/0062889 A1* | 3/2007 | Salzmann | 211/41.18 |

* cited by examiner

GLASS SUBSTRATE CASSETTE AND PICK-AND-PLACE SYSTEM FOR GLASS SUBSTRATE

BACKGROUND OF THE INVENTION

1. Field of the Invention

The present invention relates to the field of liquid crystal displaying techniques, and in particular to a glass substrate cassette and pick-and-place system for glass substrate.

2. The Related Arts

The glass substrates for liquid crystal panels are often stored in glass substrate cassette. The demands on the support effect during storage and convenient pick-and-place during transportation of the glass substrate cassette grows increasingly higher.

A known glass substrate cassette comprises a rectangular hollow shell case with a plurality of glass substrate support surfaces. A side of the shell is disposed with opening for pick-and-place. The support surfaces are arranged with spacing gap vertically. Each support surface comprises a plurality of support lines disposed in parallel.

When glass substrate is placed inside the glass substrate cassette, the glass substrate is increasingly prone to bend and deform as the size of the glass substrate increases.

When glass substrate is picked from the cassette, a conveyor belt is required to insert underneath the support surface of the glass substrate cassette. After the roller is located in the gap between the support lines, the glass substrate is pushed upward and then carried (i.e. rolled out) by the conveyor belt.

However, because the gap between the glass substrates placed in adjacent support surfaces is small and the center area of the glass substrate is prone to bend and deform, to avoid damaging the glass substrate, the above picking method can only be performed from the bottom up sequentially to retrieve the glass substrates, instead of picking and placing glass substrate at any layer of support surface.

SUMMARY OF THE INVENTION

The technical issue to be addressed by the present invention is to provide a glass substrate cassette convenient for picking and placing glass substrate in any layer, and a pick-and-place system for glass substrate.

The present invention provides a glass substrate cassette for storing glass substrates, which comprises: a cassette case, comprising a pair of side walls disposed in parallel and vertically; a plurality of support racks, disposed inside the cassette case for supporting glass substrates, disposed vertically with spacing gaps, each support rack comprising a pair of connecting elements supporting respectively the pair of side walls and a plurality of support elements lined up in parallel along a first horizontal direction and connected to the pair of connecting elements along a second horizontal direction perpendicular to the first horizontal direction, the support elements being metal rods; locking device, located on two ends of side walls for stopping connecting elements from moving along the first horizontal direction with respect to the side walls in a locked state, and allowing connecting element to move along the first horizontal direction with respect to the side walls and at least partially beyond the cassette case in an unlocked state.

According to a preferred embodiment of the present invention, the metal rod is covered with a layer of Polyether ether ketone (PEEK) resin.

According to a preferred embodiment of the present invention, the side wall is disposed with sliding trench, the connecting element is disposed inside the sliding trench and can move along the first horizontal direction with respect to the sliding trench.

According to a preferred embodiment of the present invention, the glass substrate cassette further comprises a restricting mechanism, for stopping connecting elements from disengaging from the sliding trench.

The present invention provides a glass substrate cassette for storing glass substrates, which comprises: a cassette case, comprising a pair of side walls disposed in parallel and vertically; a plurality of support racks, disposed inside the cassette case for supporting glass substrates, disposed vertically with spacing gaps, each support rack comprising a pair of connecting elements supporting respectively the pair of side walls and a plurality of support elements lined up in parallel along a first horizontal direction and connected to the pair of connecting elements along a second horizontal direction perpendicular to the first horizontal direction, connecting element able to move along the first horizontal direction with respect to the side walls and at least partially beyond the cassette case.

According to a preferred embodiment of the present invention, the support elements are metal rods.

According to a preferred embodiment of the present invention, the metal rod is covered with a layer of Polyether ether ketone (PEEK) resin.

According to a preferred embodiment of the present invention, the side wall is disposed with sliding trench, the connecting element is disposed inside the sliding trench and can move along the first horizontal direction with respect to the sliding trench.

According to a preferred embodiment of the present invention, the glass substrate cassette further comprises a locking device, located on two ends of side walls for stopping connecting elements from moving along the first horizontal direction with respect to the side walls in a locked state, and allowing connecting element to move along the first horizontal direction with respect to the side walls and at least partially beyond the cassette case in an unlocked state.

According to a preferred embodiment of the present invention, the glass substrate cassette further comprises a restricting mechanism, for stopping connecting elements from disengaging from the sliding trench.

The present invention provides a pick-and-place system for glass substrates, which comprises: a glass substrate cassette for storing glass substrates, the glass substrate cassette comprising: a cassette case, comprising a pair of side walls disposed in parallel and vertically; a plurality of support racks, disposed inside the cassette case for supporting glass substrates, disposed vertically with spacing gaps, each support rack comprising a pair of connecting elements supporting respectively the pair of side walls and a plurality of support elements lined up in parallel along a first horizontal direction and connected to the pair of connecting elements along a second horizontal direction perpendicular to the first horizontal direction; a docking device, comprising a transport mechanism and a lifting mechanism, the lifting mechanism being for adjusting the height of the transport mechanism, and the transport mechanism comprising a plurality of transport axes along a first horizontal direction; when the support rack moving along the first horizontal direction with respect to the cassette case and moving partially beyond the cassette case, the lifting mechanism transmitting the transport mechanism to push the glass substrate supported by support rack upwards and the transport mechanism transporting the glass substrate out of the support rack.

According to a preferred embodiment of the present invention, the support elements are metal rods.

According to a preferred embodiment of the present invention, the side wall is disposed with sliding trench, the connecting element is disposed inside the sliding trench and can move along the first horizontal direction with respect to the sliding trench.

According to a preferred embodiment of the present invention, the transport mechanism further comprises a plurality of rollers sheathed to the transport axes, and the rollers push the glass substrate upwards.

The efficacy of the present invention is that to be distinguished from the state of the art. In comparison to the known technique, the support racks of the glass substrate cassette of the present invention can extend beyond the cassette case so that the glass substrate at any layer can be picked and placed. Furthermore, a support rack comprises a plurality of support elements lined up in parallel along the first horizontal direction, and the contact area between the support elements and the glass substrate is small. Therefore, the potential damage caused by friction on glass substrate is smaller.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

The following description refers to the drawings and embodiments of the present invention.

Figure 1:
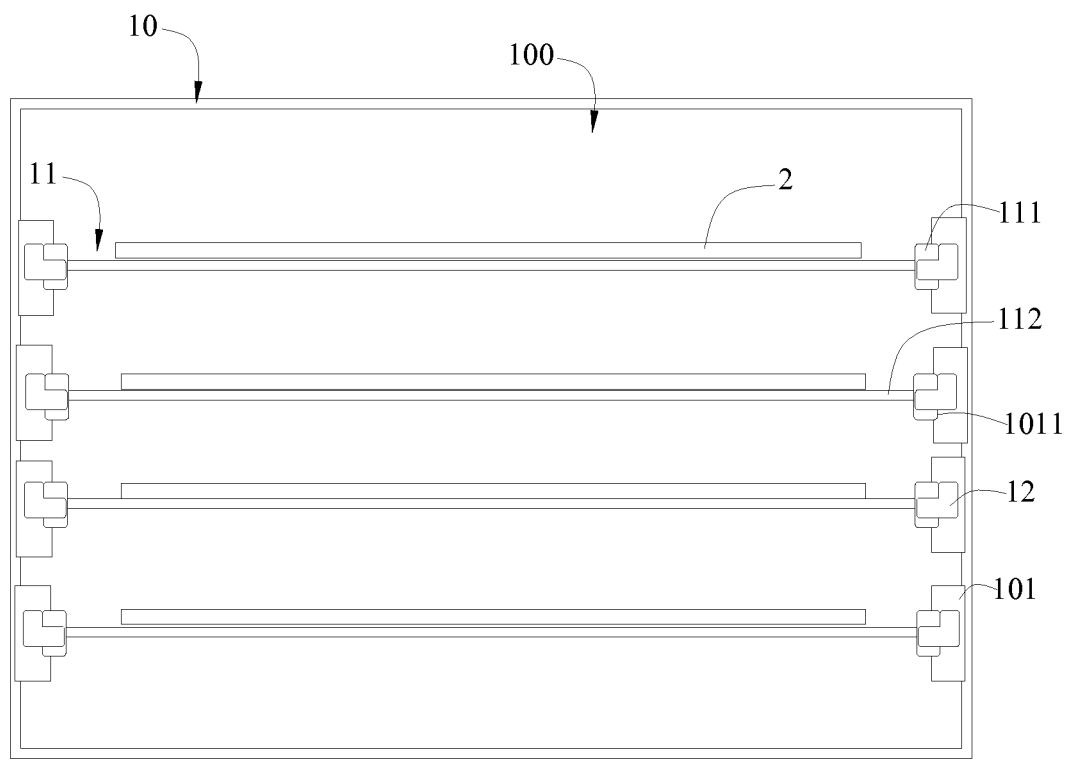
FIG. 1 is a main schematic view showing the structure of a glass substrate cassette of the present invention.
Figure 2:
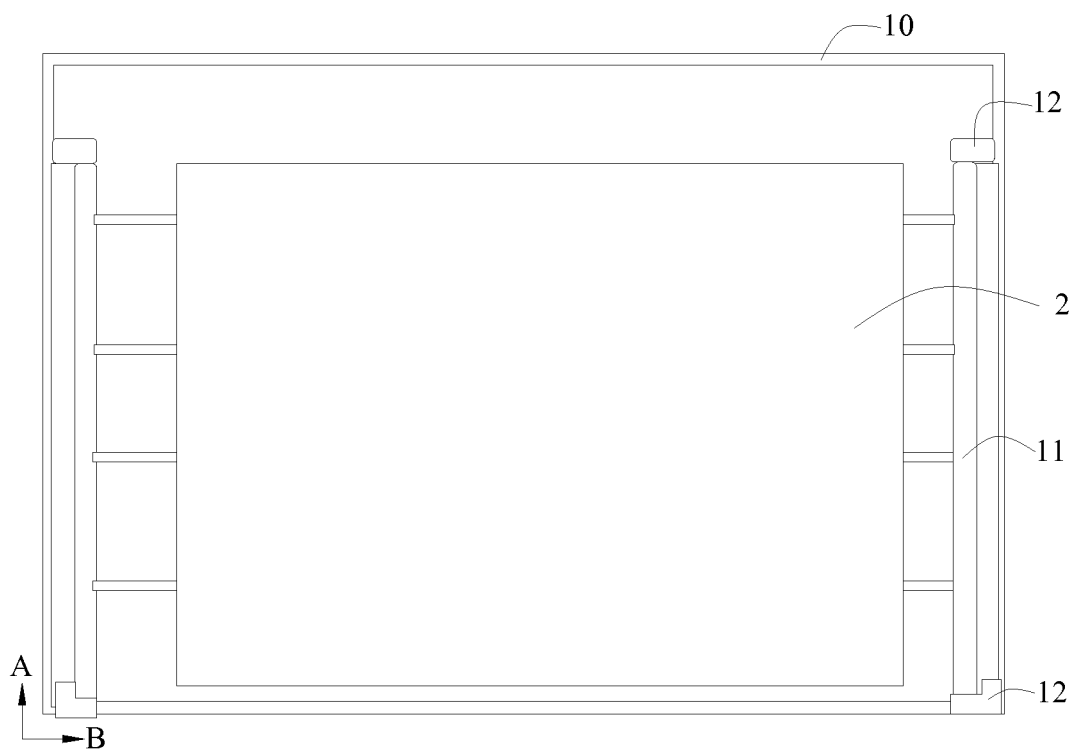
FIG. 2 is a top view of the glass substrate cassette shown in FIG. 1.
Figure 3:
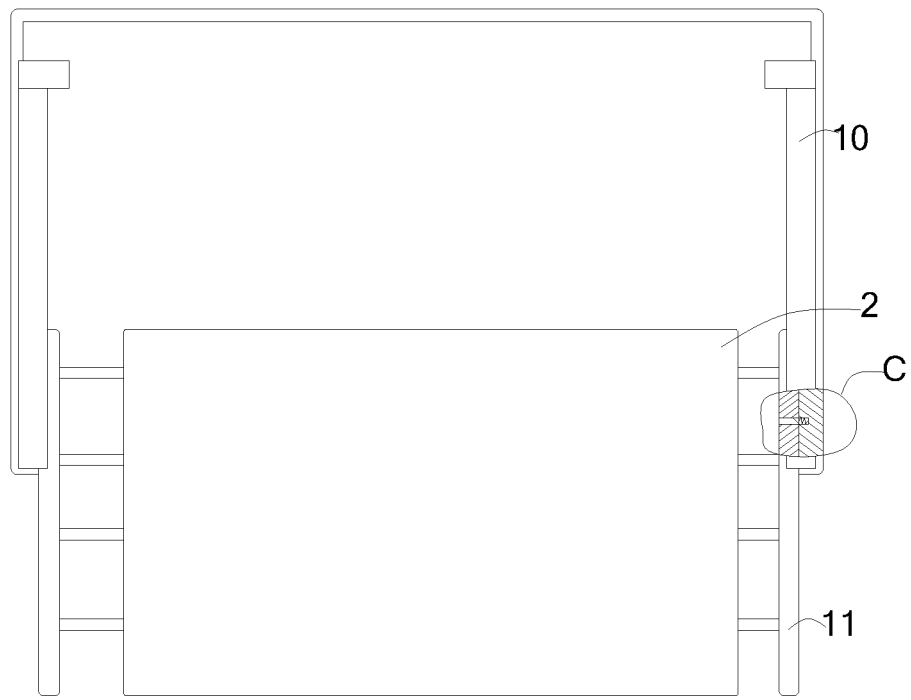
FIG. 3 is a top view of the support rack partially beyond the cassette case shown in FIG. 2.

Referring to FIGS. 1-3, a glass substrate cassette 100 of the present invention is for storing glass substrates 2. Glass substrate cassette 100 comprises a cassette case 10, a plurality of support racks 11 and a locking device 12.

Cassette case 10 is a rectangular hollow container, comprising a pair of side walls 101 disposed in parallel and vertically.

A plurality of support racks 11 is disposed inside cassette case 10 for supporting glass substrates 2. Support racks 11 are disposed vertically with spacing gaps. Each support rack 11 comprises a pair of connecting elements 111 and a plurality of supporting elements 112. Connecting elements 111 are supported respectively by the pair of side walls 101. Support elements 112 are lined up in parallel along a first horizontal direction A and connected to the pair of connecting elements 111 along a second horizontal direction B perpendicular to the first horizontal direction A.

Connecting elements 111 can move along the first horizontal direction A with respect to side wall 101 and move at partially beyond cassette case 10.

Preferably, support elements 112 are metal rods, and are covered with a layer of polyether ether ketone (PEEK) resin. Support elements 112 are preferably metal because metal rods are not prone to elastic deformation and provide sufficient strength required by glass substrate 2 to avoid center area of glass substrate 2 supported by support elements 112 from bending and deforming to cause breakage. In addition, because metal rod is a cylinder shape, the contact area between glass substrate 2 and support element 112 (thus the support rack 11) is smaller. Therefore, the potential damage caused by friction on glass substrate 2 is smaller.

Figure 6:
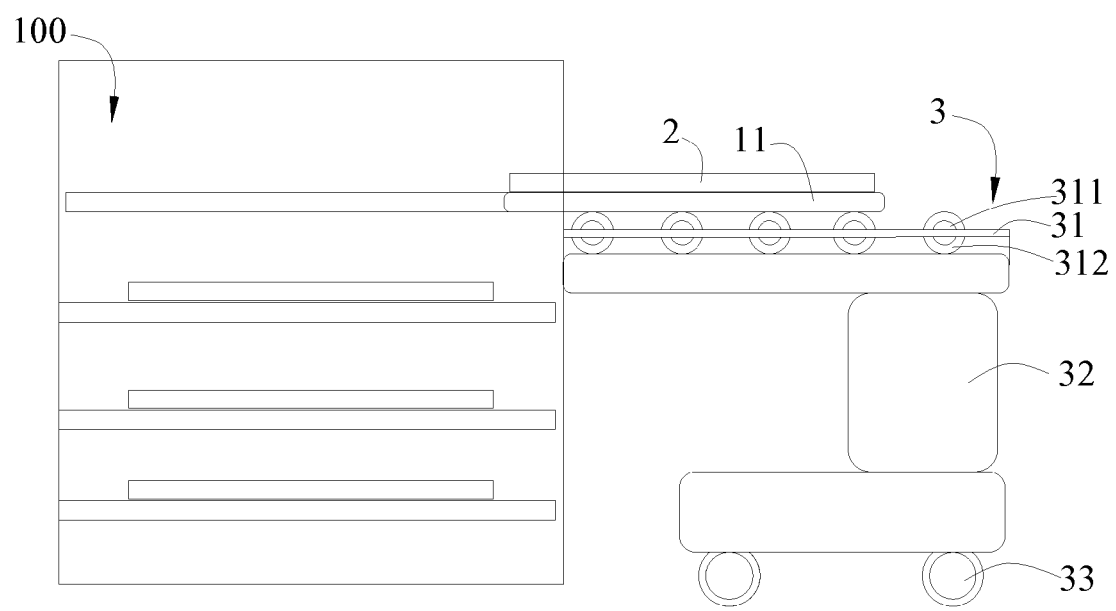
FIG. 6 is a side view of the pick-and-place system for glass substrate according to the present invention.

Furthermore, support elements 112 are lined up with spacing gaps so that support rack 11 can be supported by docking device 3 when support rack 11 is pulled beyond cassette case 10 (as shown in FIG. 6). Docking device 3 will be described momentarily in the following description of pick-and-place system.

Support element 112 is covered with a layer of PEEK resin because PEEK resin is self-lubricated to further reduce the friction of support rack 11 on glass substrate 2.

In the instant embodiment, side wall 101 is disposed with convex sliding trench 1011. Connecting element 111 is disposed inside sliding trench 1011 of side wall 101 to be supported by side wall 101 and can move along the first horizontal direction A with respect to side wall 101. In actual application, the embedding relation between side wall 101 and connecting element 111 can be reversed, that is, connecting element 111 is disposed with sliding trench (not shown) and side wall 101 is disposed with convex sliding track (not shown). The sliding track on side wall 101 can be embedded into sliding trench of connecting element 111.

In practice, the sliding of connecting element 111 with respect to side wall 101 is not limited to the direct embedding of sliding mechanism between connecting element 111 and side wall 101. For example, connecting element 111 and side wall 101 can both be disposed with matching sliding tracks (not shown), and the sliding tracks can be matched to slide.

When glass substrate cassette 100 is in use and glass substrate 2 is to be picked or placed, corresponding support rack 11 should be able to pull out. However, during transportation, support rack 11 should not shake with respect to cassette 10. Through the controlling of locking device 12, the movement of support rack 11 with respect to cassette 10 can be controlled.

Specifically, in the instant embodiment, locking device 12 are located respectively on two ends of side walls 101 for stopping connecting elements 111 from moving along the first horizontal direction A with respect to sliding trench 1011 in a locked state, and allowing connecting element 111 to move along the first horizontal direction A with respect to sliding trench 1011 in an unlocked state.

Preferably, two ends of a pair of side walls 101 are both disposed with locking device 12. In actual application, only one side wall 101 disposed with locking device 12 on both ends is also possible. Alternatively, one end on both side walls disposed with locking device 12 is also permissible, as long as that connecting elements 111 cannot move along the first horizontal direction A with respect to sliding trench 1011 in a locked state.

Locking device 12 can be realized in various ways, for example, fastened to side wall 101 in a rotatable or disengageable manner, and so on. In actual application, locking devices 12 on two ends of side wall 101 can also be different; for example, locking device 12 on one end of side wall 101 can be fixedly connected or a stop arm (not shown) extending from side wall 101 for stopping connecting element 111 to extend beyond the end. In usage, the stop arm is not extended. Locking device 12 on the other end of side wall 101 can be an element connected to side wall 101 a rotatable or disengageable manner. Through the change of the relative state of this element and side wall 101, the switch between the locking state and unlocking state is realized.

Preferably, glass substrate cassette 100 further comprises a restricting mechanism, for stopping connecting elements 111 from disengaging from sliding trench 1011. Also referring to FIG. 4, in the instant embodiment, restricting mechanism comprises concave part 1112 disposed on connecting element 111 and convex part 1012 disposed on side wall 101. When connecting element 111 slides with respect to side wall 101, concave part 1112 and convex part 1012 coincide in position and convex part 1012 slides into and stuck inside concave part 1112 to stop connecting element 111 from further moving with respect to side wall 101.

In actual application, the structure and realization of restricting mechanism is not limited to the instant embodiment. For example, when the sliding between connecting element 111 and side wall 101 is realized through external guiding tracks, the restricting mechanism can be mutually sheathed mechanism disposed on guiding tracks. The other possible embodiments will not be described here.

Figure 4:
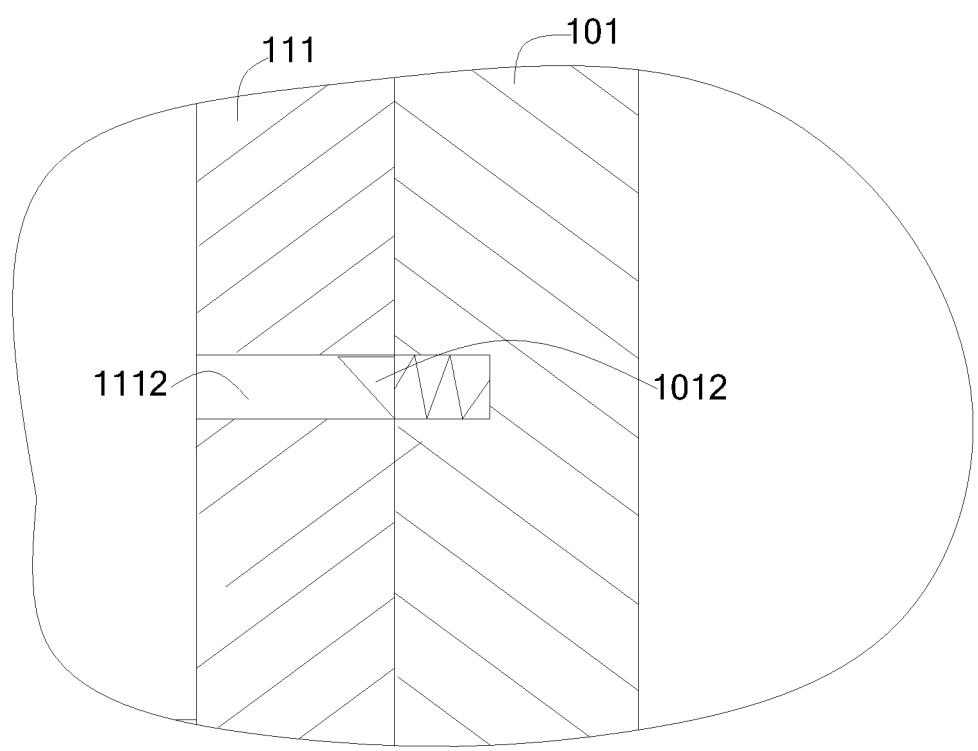
FIG. 4 is an enlarged cross-sectional view of area C shown in FIG. 3.
Figure 5:
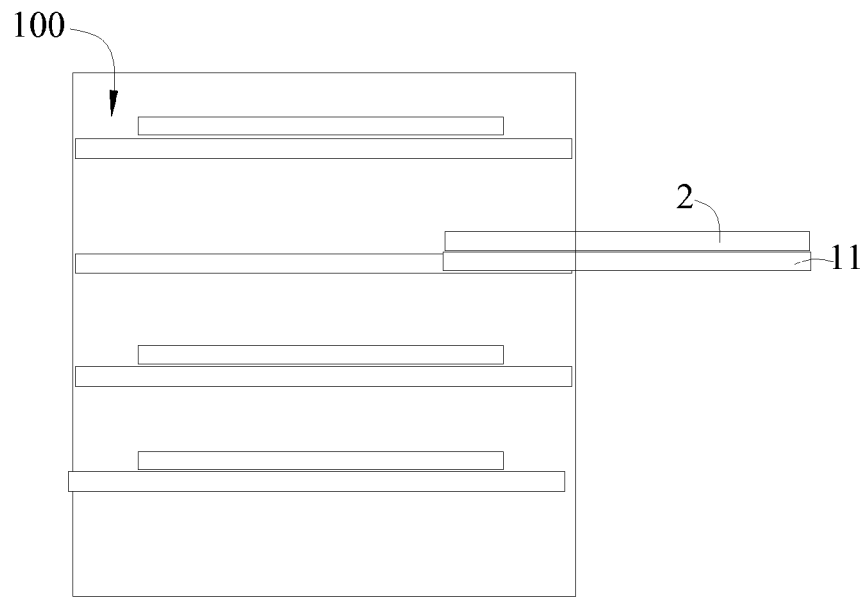
FIG. 5 is a side view of one of the support racks partially beyond the cassette case shown in FIG. 3.

Refer to FIGS. 4-6. The present invention further provides a pick-and-place system for glass substrates 2.

The pick-and-place system for glass substrates comprises glass substrate cassette 100 and docking device 3.

Glass substrates 2 are stored in glass substrate cassette 100. To inspect glass substrates 2 stored in glass substrate cassette 100, support rack 11 is pulled out. Also refer to FIG. 4. When support rack 11 is pulled out with respect to cassette case 10, end part of support rack 11 can droop. When end part of support rack 11 droops, glass substrate 2 supported by support rack 2 may cause friction with respect to support rack 2 or even fall off from the drooping end of support rack 11. Docking device 3 can stop glass substrate 2 from causing friction with respect to support rack 11 or falling from support rack 11.

Docking device 3 comprises a transport mechanism 31, a lifting mechanism 32 and a horizontal moving mechanism 33. Horizontal moving mechanism 33 is for adjusting horizontal position of transport mechanism 31 and lifting mechanism 32 is for adjusting height of transport mechanism 31. Transport mechanism 31 comprises a plurality of transport axels 311 disposed in parallel along a first horizontal direction A, and a plurality of rollers 312 sheathed onto transport axels 311.

When support rack 11 moves along the first horizontal direction A with respect to cassette case 10 and moves partially beyond cassette case 10, lifting mechanism 32 transmits transport mechanism 31 to push glass substrate 2, which is originally supported by support rack 11, upwards. Transport axels 311 of transport mechanism 31 are located between support elements 112 of support rack 11. Lifting mechanism 32 transmits transport mechanism 31 upwards so that rollers 312 sheathed onto transport axels 311 lift glass substrate 2.

When glass substrate 2 is lifted, glass substrate 2 will neither cause friction with drooping end of support rack 11 nor fall off from drooping end of support rack 11. When glass substrate 2 is damaged and need to be retrieved from glass substrate cassette 100, transport mechanism 31 is further transmitted to transport glass substrate 2 out of support rack 11.

In comparison to the known technique, support racks 11 of glass substrate cassette 100 of the present invention can extend beyond cassette case 10 so that glass substrate 2 at any layer can be picked and placed. Furthermore, a support rack 11 comprises a plurality of support elements 112 lined up in parallel along the first horizontal direction, and the contact area between support elements 112 and glass substrate 2 is small. Therefore, the potential damage caused by friction on glass substrate 2 is smaller.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A glass substrate cassette for storing glass substrates, which comprises:
   a cassette case, comprising a pair of side walls disposed in parallel and vertically;
   a plurality of support racks, disposed inside the cassette case for supporting glass substrates, disposed vertically with spacing gaps, each support rack comprising a pair of connecting elements supported respectively by the pair of side walls and a plurality of support elements lined up in parallel along a first horizontal direction and connected to the pair of connecting elements along a second horizontal direction perpendicular to the first horizontal direction, the support elements being metal rods; and
   locking device, located on two ends of side walls for stopping the connecting elements from moving along the first horizontal direction with respect to the side walls in a locked state, and allowing the connecting elements to move along the first horizontal direction with respect to the side walls and at least partially beyond the cassette case in an unlocked state;
   wherein, the support elements are supported only by the pair of side walls through the pair of connecting elements.

2. The glass substrate cassette as claimed in claim 1, characterized in that the metal rod is covered with a layer of Polyether ether ketone (PEEK) resin.

3. The glass substrate cassette as claimed in claim 1, characterized in that the side wall is disposed with sliding trench, the connecting element is disposed inside the sliding trench and can move along the first horizontal direction with respect to the sliding trench.

4. The glass substrate cassette as claimed in claim 3, characterized in that the glass substrate cassette further comprises a restricting mechanism, for stopping the connecting elements from disengaging from the sliding trench.

5. A glass substrate cassette for storing glass substrates, which comprises:
   a cassette case, comprising a pair of side walls disposed in parallel and vertically; and
   a plurality of support racks, disposed inside the cassette case for supporting glass substrates, disposed vertically with spacing gaps, each support rack comprising a pair of connecting elements supported respectively by the pair of side walls and a plurality of support elements lined up in parallel along a first horizontal direction and connected to the pair of connecting elements along a second horizontal direction perpendicular to the first horizontal direction, the connecting elements able to move along the first horizontal direction with respect to the side walls and at least partially beyond the cassette case;

wherein, the support elements are supported only by the pair of side walls through the pair of connecting elements.

6. The glass substrate cassette as claimed in claim 5, characterized in that the support elements are metal rods.

7. The glass substrate cassette as claimed in claim 6, characterized in that the metal rod is covered with a layer of Polyether ether ketone (PEEK) resin.

8. The glass substrate cassette as claimed in claim 5, characterized in that the side wall is disposed with sliding trench, the connecting element is disposed inside the sliding trench and can move along the first horizontal direction with respect to the sliding trench.

9. The glass substrate cassette as claimed in claim 8, characterized in that the glass substrate cassette further comprises a locking device, located on two ends of side walls for stopping the connecting elements from moving along the first horizontal direction with respect to the side walls in a locked state, and allowing the connecting elements to move along the first horizontal direction with respect to the side walls and at least partially beyond the cassette case in an unlocked state.

10. The glass substrate cassette as claimed in claim 8, characterized in that the glass substrate cassette further comprises a restricting mechanism, for stopping the connecting elements from disengaging from the sliding trench.

11. A pick-and-place system for glass substrates, which comprises:

a glass substrate cassette for storing glass substrates, the glass substrate cassette comprising: a cassette case, comprising a pair of side walls disposed in parallel and vertically; a plurality of support racks, disposed inside the cassette case for supporting glass substrates, disposed vertically with spacing gaps, each support rack comprising a pair of connecting elements supported respectively by the pair of side walls and a plurality of support elements lined up in parallel along a first horizontal direction and connected to the pair of connecting elements along a second horizontal direction perpendicular to the first horizontal direction;

a docking device, comprising a transport mechanism and a lifting mechanism, the lifting mechanism being for adjusting the height of the transport mechanism, and the transport mechanism comprising a plurality of transport axes along a first horizontal direction; wherein the connecting elements move along the first horizontal direction with respect to the cassette case and move partially beyond the cassette case, wherein the lifting mechanism transmits the transport mechanism to push the glass substrate supported by support rack upwards and the transport mechanism transports the glass substrate out of the support rack;

wherein, the support elements are supported only by the pair of side walls through the pair of connecting elements.

12. The pick-and-place system as claimed in claim 11, characterized in that the support elements are metal rods.

13. The pick-and-place system as claimed in claim 11, characterized in that the side wall is disposed with sliding trench, the connecting element is disposed inside the sliding trench and can move along the first horizontal direction with respect to the sliding trench.

14. The pick-and-place system as claimed in claim 11, characterized in that the transport mechanism further comprises a plurality of rollers sheathed to the transport axels, and the rollers push the glass substrate upwards.

15. The pick-and-place system as claimed in claim 11, characterized in that the transport axels of the transport mechanism are located between the support elements of the support rack when the transport mechanism pushes the glass substrate supported by the support rack upwards.

* * * * *